US010599790B2

(12) United States Patent
Pelivanov et al.

(10) Patent No.: US 10,599,790 B2
(45) Date of Patent: *Mar. 24, 2020

(54) ADVANCED DOWNHOLE WAVEFORM INTERPRETATION

(71) Applicants: University of Washington, Seattle, WA (US); BP Corporation North America Inc., Houston, TX (US)

(72) Inventors: Ivan Pelivanov, Seattle, WA (US); Matthew O'Donnell, Seattle, WA (US); Abraham Vereide, Sugar Land, TX (US)

(73) Assignees: UNIVERSITY OF WASHINGTON, Seattle, WA (US); BP CORPORATION NORTH AMERICA INC., Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/144,956

(22) Filed: Sep. 27, 2018

(65) Prior Publication Data

US 2019/0034568 A1 Jan. 31, 2019

Related U.S. Application Data

(63) Continuation of application No. 14/962,368, filed on Dec. 8, 2015, now Pat. No. 10,102,315.

(Continued)

(51) Int. Cl.
*G06F 17/50* (2006.01)
*E21B 47/00* (2012.01)
(Continued)

(52) U.S. Cl.
CPC ...... *G06F 17/5009* (2013.01); *E21B 47/0005* (2013.01); *E21B 47/082* (2013.01); *G01V 1/282* (2013.01); *G01V 1/50* (2013.01)

(58) Field of Classification Search
CPC .................................................. G06F 17/5009
See application file for complete search history.

(56) References Cited

U.S. PATENT DOCUMENTS

| 5,216,638 A | 6/1993 | Wright |
| 5,274,604 A | 12/1993 | D'Angelo et al. |

(Continued)

FOREIGN PATENT DOCUMENTS

| WO | 2012177262 | 12/2012 |
| WO | 2015/023384 | 2/2015 |

(Continued)

OTHER PUBLICATIONS

U.S. Appl. No. 14/962,368, "Non-Final Office Action", dated Dec. 27, 2017, 12 pages.

(Continued)

*Primary Examiner* — Nicholas J Tobergte
(74) *Attorney, Agent, or Firm* — Kilpatrick Townsend & Stockton LLP

(57) ABSTRACT

Systems and methods process a measured ultrasonic response waveform to determine a well casing thickness and an acoustic impedance of a sealing medium surrounding the well casing. An array of simulated response waveforms corresponding to a set of candidate acoustic impedances for the sealing medium surrounding the well casing and a set of candidate well casing thicknesses is generated. A simulated response waveform from the array of simulated response waveforms is identified that best matches the measured response waveform so as to determine the sealing medium acoustic impedance.

19 Claims, 12 Drawing Sheets

Related U.S. Application Data

(60) Provisional application No. 62/088,958, filed on Dec. 8, 2014.

(51) Int. Cl.
*E21B 47/08* (2012.01)
*G01V 1/28* (2006.01)
*G01V 1/50* (2006.01)

(56) References Cited

U.S. PATENT DOCUMENTS

| | | | |
|---|---|---|---|
| 7,522,471 | B2 | 4/2009 | Froelich et al. |
| 10,102,315 | B2 * | 10/2018 | Pelivanov ............ G06F 17/5009 |
| 2006/0233048 | A1 | 10/2006 | Froelich et al. |
| 2006/0262643 | A1 | 11/2006 | Blankinship et al. |
| 2010/0061183 | A1 | 3/2010 | Mandal et al. |
| 2013/0155812 | A1 | 6/2013 | Froelich et al. |
| 2014/0052376 | A1 | 2/2014 | Guo et al. |
| 2016/0162614 | A1 | 6/2016 | Pelivanov et al. |

FOREIGN PATENT DOCUMENTS

| | | |
|---|---|---|
| WO | 2015/023386 | 2/2015 |
| WO | 2015/093960 | 6/2015 |

OTHER PUBLICATIONS

Bond et al., "Evaluation of Non-Nuclear Techniques for Well Logging: Technology Evaluation", Pacific Northwest National Laboratory Report No. PNNL-19867, Nov. 2010, 116 pages.

Punurai et al., "Characterization of dissipation losses in cement paste with diffuse ultrasound", Mechanics Research Communications, vol. 34 Issue 3, Apr. 2007, pp. 289-294.

Tong et al., "Tile-wall bonding integrity inspection based on time-domain features of impact acoustics", Sensors and Actuators A: Physical, vol. 132 No. 2, Nov. 2006, pp. 557-566.

\* cited by examiner

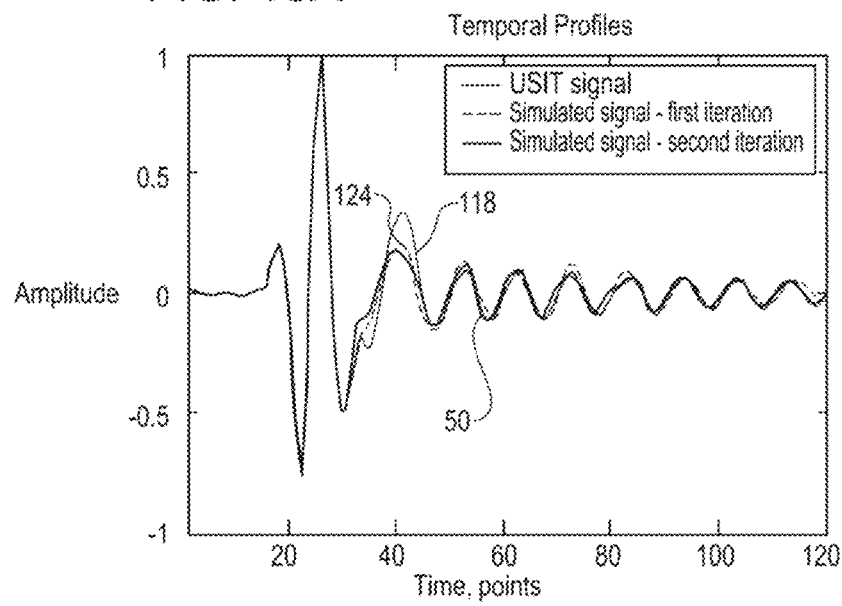
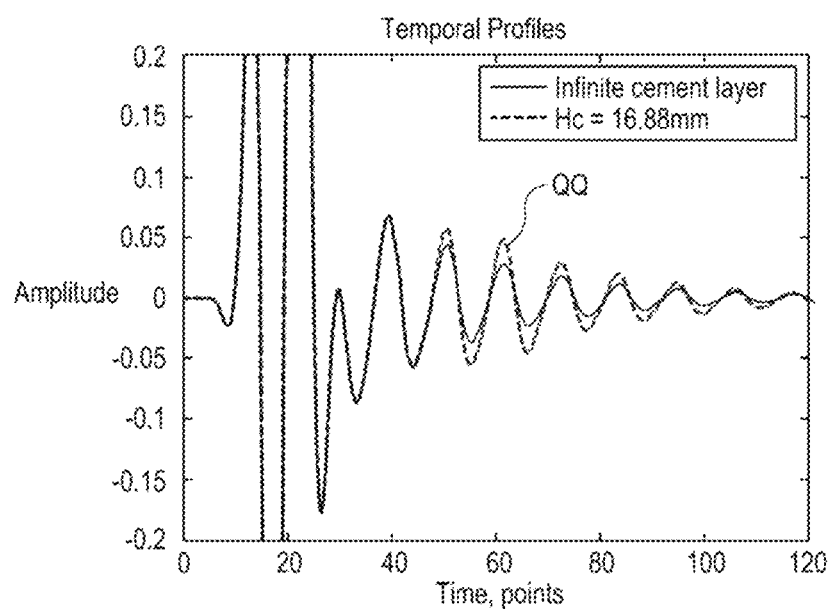

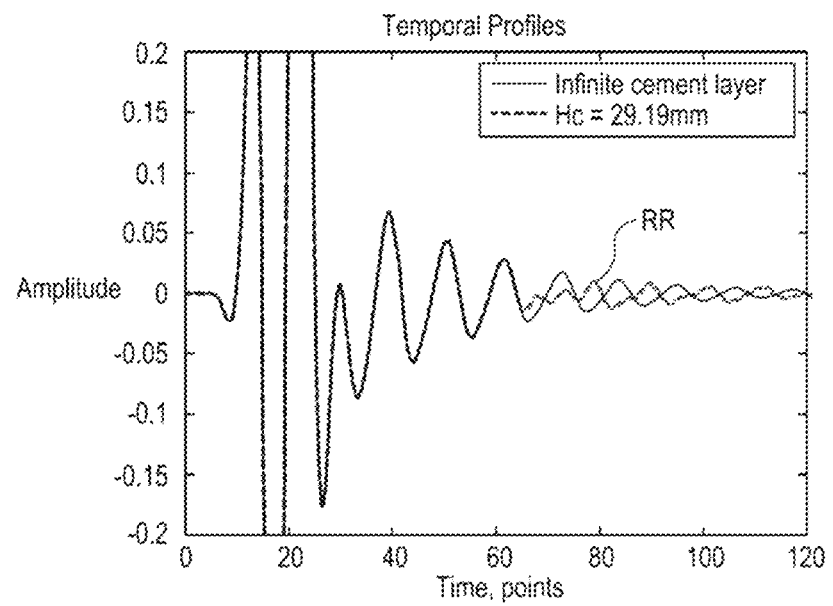

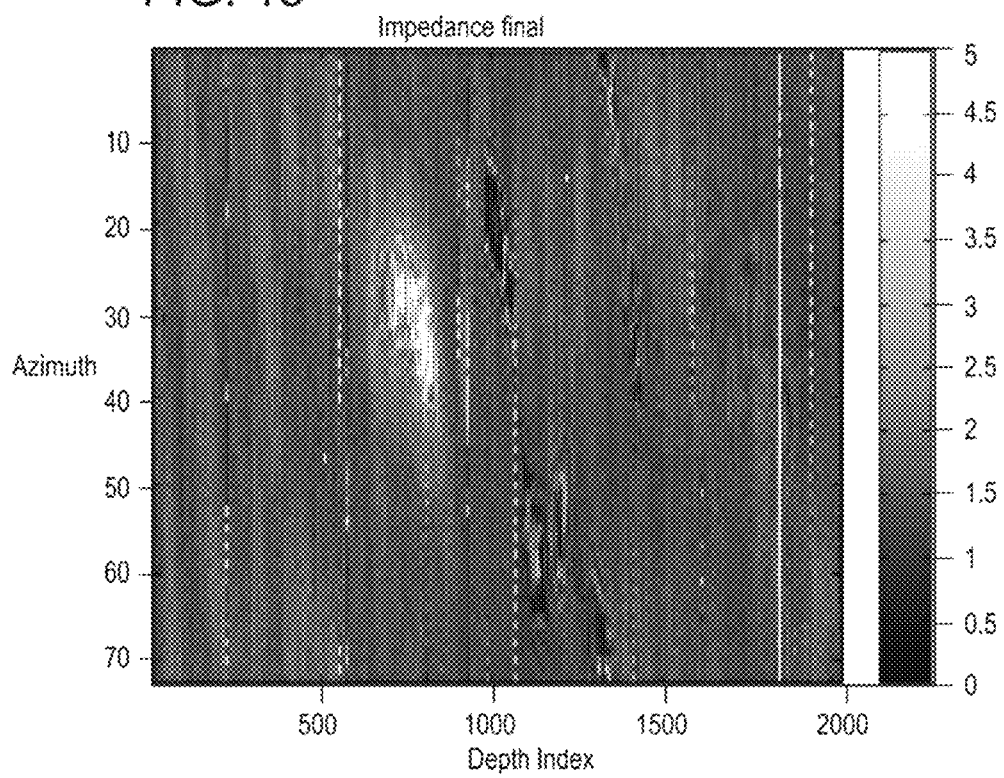

ADVANCED DOWNHOLE WAVEFORM INTERPRETATION

CROSS-REFERENCES TO RELATED APPLICATIONS

This application is a continuation of U.S. application Ser. No. 14/962,368, filed Dec. 8, 2015, which application claims the benefit of U.S. Provisional Application No. 62/088,958, filed Dec. 8, 2014, the entire contents of which are hereby incorporated in their entirety for all purposes.

BACKGROUND

The process for creating a well (e.g., oil, natural gas) typically includes drilling a hole through a ground formation, inserting a well casing into the hole, and filling the resulting annulus between the interior surface of the drilled hole and the exterior surface of the well casing with a suitable sealing medium (e.g., cement). The sealing medium serves to prevent flow of a liquid (e.g., oil) and/or a gas (e.g., natural gas) along the annulus so as to inhibit and preferably prevent leakage of the liquid and/or gas via the annulus. Typically, the sealing medium is injected into the annulus at an end of a length of the well casing and flows longitudinally along the annulus to fill the annulus along the length of the well casing.

Unfortunately, the injection of the sealing medium may sometimes result in an annulus that is inadequately sealed. Because an inadequately sealed annulus can result in significant detrimental leakage along the annulus, it is important that any inadequately sealed portions of the annulus be identified and fixed. Ultrasonic inspection is typically used to evaluate if the annulus is adequately sealed. An ultrasonic inspection tool is moved along the inside of the well casing, transmits an ultrasonic pulse towards the inside wall of the well casing, and generates an output signal in response to the returning ultrasonic waves. Analysis of the output signal is performed to evaluate, in part, the acoustic impedance of the sealing medium in the annulus. The acoustic impedance of the sealing medium can then be assessed to evaluate if the annulus at the inspected location is adequately or inadequately sealed. The process is repeated along the depth of the well casing and repeated at different azimuth angles to sufficiently inspect the annulus.

BRIEF SUMMARY

The following presents a simplified summary of some embodiments of the invention in order to provide a basic understanding of the invention. This summary is not an extensive overview of the invention. It is not intended to identify key/critical elements of the invention or to delineate the scope of the invention. Its sole purpose is to present some embodiments of the invention in a simplified form as a prelude to the more detailed description that is presented later.

Improved approaches and related systems are provided for processing a measured response waveform generated by a dowohole ultrasonic inspection tool used to inspect a well. Simulated response waveforms are generated based on the measured response waveform. Each of the simulated response waveforms can be further based on any suitable combination of four independent parameters: a respective candidate well casing thickness, a respective candidate acoustic impedance for a sealing medium in the annulus around the well casing, a respective candidate annulus thickness, and a respective candidate acoustic impedance for the ground formation surrounding the annulus (i.e., inner surface of the hole). The simulated response waveforms are compared to the measured response waveform to identify which of the simulated response waveforms best matches the measured response waveform, thereby identifying a best-fit well casing thickness, a best-fit acoustic impedance for the annulus sealing medium, a best fit thickness for the annulus thickness, and/or a best fit acoustic impedance for the ground formation surrounding the annulus. In many cases, the sealing medium in the annulus can be considered infinite in extent so that the matching procedure only uses two free parameters (casing thickness and acoustic impedance of the sealing medium in the annulus). The casing thickness and acoustic impedance of the sealing medium in the annulus change the acoustic signal in very different ways and, therefore, the fitting procedure produces the optimal estimate of the acoustic impedance of the annulus sealing medium independent of the casing thickness. For other cases, especially when the annulus is thin, computing the best fit using all four parameters produces estimates of the casing thickness and the acoustic impedance of the sealing medium in the annulus independent of the annulus thickness and the acoustic impedance of the ground formation surrounding the annulus. The signal processing described herein can greatly reduce the influence of the third interface (between the annulus sealing medium and the ground formation surrounding the annulus) on estimates of the acoustic impedance of the sealing medium in the annulus, an advantage not provided by prior approaches. The resulting estimates of well casing thickness surrounding annulus sealing medium acoustic impedance have been found to be significantly more accurate that those generated by prior approaches, thereby increasing confidence in the inspection results and providing better information for decisions as to whether the annulus is adequately or inadequately sealed.

Thus, in one aspect, a computer-implemented method of processing a measured ultrasonic response waveform to determine a thickness of a well casing and an acoustic impedance of a sealing medium in an annulus surrounding the well casing is provided. The method includes processing a measured response waveform resulting from an ultrasonic signal transmitted toward the well casing from within the well casing to determine an arrival time for a first reflection from the well casing. An array of simulated response waveforms is generated corresponding to the arrival time, a set of candidate acoustic impedances for the sealing medium in the annulus, a set of candidate well casing thicknesses, a set of candidate annulus thicknesses, and a set of candidate acoustic impedances for a ground formation surrounding the annulus. A best-fit simulated response waveform that best matches the measured response waveform is identified from the array of simulated response waveforms so as to identify a best-fit well casing thickness of the set of candidate well casing thicknesses, a best-fit sealing medium acoustic impedance of the set of candidate acoustic impedances for the sealing medium in the annulus, a best-fit annulus thickness of the set of candidate annulus thicknesses, and a best-fit acoustic impedance for the ground formation surrounding the annulus of the set of candidate acoustic impedances for the ground formation surrounding the annulus associated with the best-fit simulated response waveform. The method can include calculating the best-fit well casing thickness, the best-fit sealing medium acoustic impedance, the best-fit annulus thickness, and the best-fit acoustic impedance for the ground formation surrounding the annulus for a plurality of depths and a plurality of azimuth angles.

In many embodiments, a portion of the measured response waveform is processed to determine one or more parameters used to generate the array of simulated response waveforms. For example, the method can include processing a portion of the measured response waveform to determine an approximate thickness of the well casing and selecting the set of candidate well casing thicknesses based on the approximate thickness of the well casing. As another example, the method can include processing a portion of the measured response waveform to determine a transducer impulse response for an ultrasonic transducer used to generate the measured response waveform. In many embodiments, each of the array of simulated response waveforms is based on the transducer impulse response.

Each of the simulated response waveforms can be generated using any suitable approach. For example, generating each of the array of simulated response waveforms can include: (a) calculating amplitudes for simulated echo waxes returning to the ultrasonic transducer from the well casing; (b) the calculating amplitudes for simulated echo waves returning to the ultrasonic transducer from an interface between the sealing medium in the annulus and the ground formation surrounding the annulus; (c) generating corrected amplitudes for the simulated echo waves by correcting the amplitudes and pulse shape for the simulated echo waves to account for diffraction, refraction, cylindrical wall geometry, and resulting beam size at a transducer plane of the ultrasonic transducer; (d) generating a first-iteration simulated waveform based on the corrected amplitudes; and (e) convolving the first-iteration simulated waveform with the transducer impulse response to generate the respective simulated response waveform. Each of the array of simulated response waveforms can be based on reflection and transmission coefficients for an inner surface of the well casing, an outer surface of the well casing, the outer surface of the well (i.e. outer surface of the medium in the annulus), and different order reverberations in the well casing.

In many cases encountered in ultrasonic inspection of wells, the annulus thickness is sufficiently large such that reflections of the ultrasonic signal from the annulus-well boundary interface (e.g., sealing medium/round formation interface) do not significantly impact the response waveform measured by the ultrasonic transducer. For these cases the annulus thickness can be considered infinite and the matching procedure can use only two free parameters: well casing thickness and the acoustic impedance for the sealing medium in the annulus around the well casing. For some cases where the annulus is thin enough such that reflections of the ultrasonic signal from the sealing medium/ground formation boundary do significantly impact the measured response waveform, all four parameters can be used to produce candidate waveforms that better match the measured response waveform. By accounting for reflections of the ultrasonic signal from the sealing medium/ground formation boundary, more accurate estimates of well casing thickness and acoustic impedance for a sealing medium in the annulus can be attained. In the description that follows, details of a matching procedure that employs a two-parameter model are presented. Details of a matching procedure that employs a four-parameter model are also presented by describing changes for the four-parameter model relative to the two-parameter model. The approaches described herein provide robust estimates of the well casing thickness and the acoustic impedance for the sealing medium in the annulus.

The computer-implemented method of processing the measured ultrasonic response waveform can include a second-iteration that may improve how closely a best-fit simulated response waveform matches the measured response waveform, thereby improving accuracy of the well casing thickness estimate and the sealing medium acoustic impedance estimate. For example, the method can include: (a) calculating a differential signal between the measured response waveform and the best-fit simulated response waveform; (b) calculating a corrected transducer impulse response for the ultrasonic transducer by correcting the transducer impulse response based on the differential signal; (c) generating a second-iteration array of simulated response waveforms based on the corrected transducer impulse response and corresponding to the signal arrival time, a second-iteration set of candidate acoustic impedances for the annulus sealing medium surrounding the well casing, a second-iteration set of candidate well casing thicknesses, a second-iteration set of candidate annulus thicknesses, and a second-iteration set of candidate acoustic impedances for the ground formation surrounding the annulus; and (d) identifying a second-iteration best-fit simulated response waveform from the second-iteration array of simulated response waveforms that best matches the measured response waveform so as to identify a second-iteration best-fit well casing thickness of the second-iteration set of candidate well casing thicknesses, a second-iteration best-fit surrounding sealing medium acoustic impedance of the second-iteration set of candidate acoustic impedances for the sealing medium in the annulus, a second-iteration best-in annulus thickness of the second-iteration set of candidate annulus thicknesses, and a second-iteration best-fit acoustic impedance for the ground formation surrounding the annulus of the second-iteration set of candidate acoustic impedances for the ground formation surrounding the annulus associated with the second-iteration best-fit simulated response waveform. Generating each of the second-iteration array of simulated response waveforms can include convolving a simulated response waveform with the corrected transducer impulse response to generate the respective simulated response waveform of the second-iteration array of simulated response waveforms.

The computer-implemented method of processing the measured ultrasonic response waveform can include generating a confidence value based on deviation between the best-fit simulated response waveform and the measured response waveform. The confidence value can be evaluated alone or in combination with the best-fit well casing thickness and the best-fit sealing medium acoustic impedance. For example, the method can include processing the best-fit well casing thickness, the best-fit sealing medium acoustic impedance, and the confidence value in combination to produce a final confidence value indicative of whether the actual sealing medium acoustic impedance is within a designated range. The method can include calculating the best-fit well casing thickness, the best-fit sealing medium acoustic impedance, and the final confidence value for a plurality of depths and a plurality of azimuth angles.

In another aspect, a system is provided for processing a measured ultrasonic response waveform to determine a well casing thickness and an acoustic impedance of a sealing medium in the annulus surrounding the well casing. The system includes a processor and a tangible memory storing non-transient instructions executable by the processor to cause the processor to perform the computer-implemented method of processing the measured ultrasonic response waveform to determine a well casing thickness and an acoustic impedance of the sealing medium in the annulus surrounding the well casing described herein.

For a fuller understanding of the nature and advantages of the present invention, reference should be made to the ensuing detailed description and accompanying drawings.

BRIEF DESCRIPTION OF THE DRAWINGS

FIG. 10A shows an overlay comparing the measured response waveform of FIG. 2 with the example first-iteration simulated response waveform of FIG. 7 and a second-iteration simulated response waveform, in accordance with many embodiments.

FIG. 10B and FIG. 10C show overlays comparing simulated response waveforms for an infinitely thick cement-filled annulus surrounding a well casing and cement-filled annuluses having two different finite thicknesses, in accordance with many embodiments.

FIG. 15 shows a resulting contour plot of acoustic impedance of the annulus sealing medium surrounding the casing for a range of depths and azimuth angles based on simulated response waveforms that account for two-dimensional effects, in accordance with many embodiments.

DETAILED DESCRIPTION

In the following description, various embodiments of the present invention will be described. For purposes of explanation, specific configurations and details are set forth in order to provide a thorough understanding of the embodiments. It will also, however, be apparent to one skilled in the art that the present invention may be practiced without the specific details. Furthermore, well-known features may be omitted or simplified in order not to obscure the embodiment being described.

Figure 1:
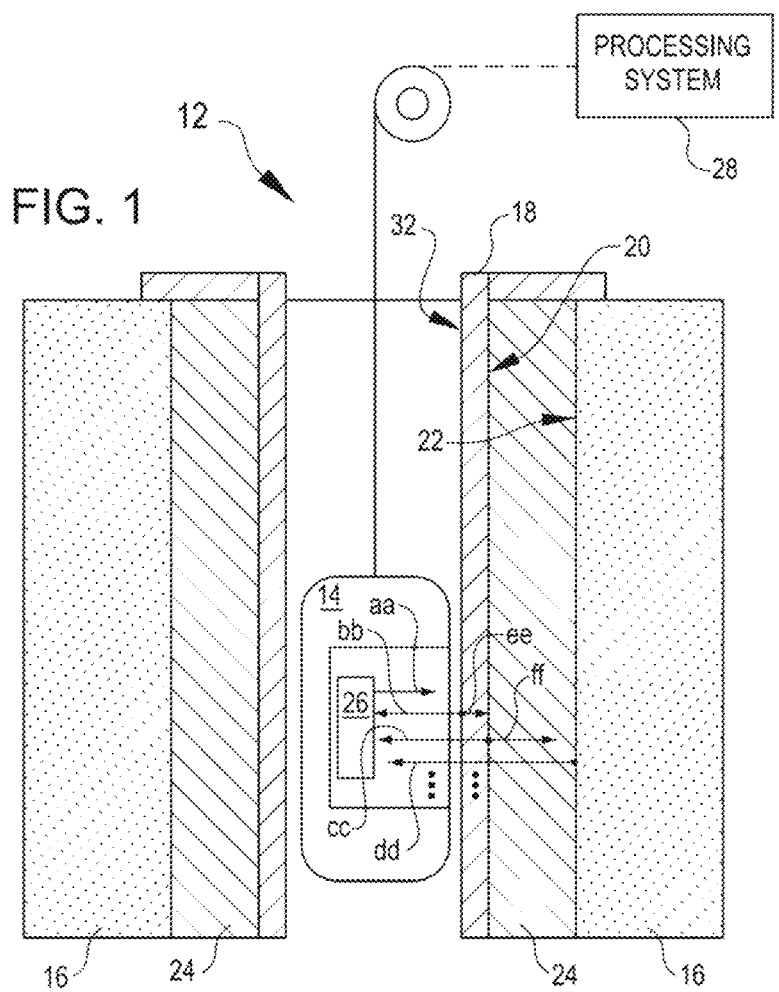
FIG. 1 is a simplified schematic drawing illustrating inspection of a well using a down-hole ultrasonic inspection tool, in accordance with many embodiments.

Referring now to the drawings, in which like reference numerals represent like parts throughout the several views, FIG. 1 illustrates inspection of a well 12 using a down-hole ultrasonic inspection tool 14, in accordance with many embodiments. The well 12 is formed by drilling a hole through a ground formation 16 and includes a well casing 18 inserted into the hole thereby forming a surrounding annulus between an outer surface 20 of the well casing 18 an inner surface 22 of the hole. A sealing medium 24 (e.g., cement) is injected into the annulus and cured to block flow of liquid and/or gas along the annulus, thereby inhibiting and preferably preventing well leakage via the annulus.

The down-hole ultrasonic inspection tool 14 includes an ultrasonic transducer 26 positioned inside the casing at a certain position from its center. The transducer sends a probe ultrasound signal (aa) towards the casing wall. The probe ultrasound signal (aa) is partially reflected back from the inner casing interface 32 and is partially propagated inside the casing. Partial reflections (bb, cc, dd) and transmissions (ee and ff) occur at all the interfaces of the layered structure of the well (i.e., mud/casing 18, casing 18/sealing medium 24, sealing medium 24/ground formation 16) and result in a long chain of back-reflected ultrasound transients (including multiple reverberations within the structural layers), contributing to the measured response waveform 50. The measured response waveform 50 is detected by the transducer 26 and can be analyzed with a numerical procedure to determine an acoustic impedance for the sealing medium 24 in the annulus surrounding the well casing 18, a well casing thicknesses, a thicknesses of the annulus, and an acoustic impedance for the ground formation surrounding the annulus.

Figure 2:
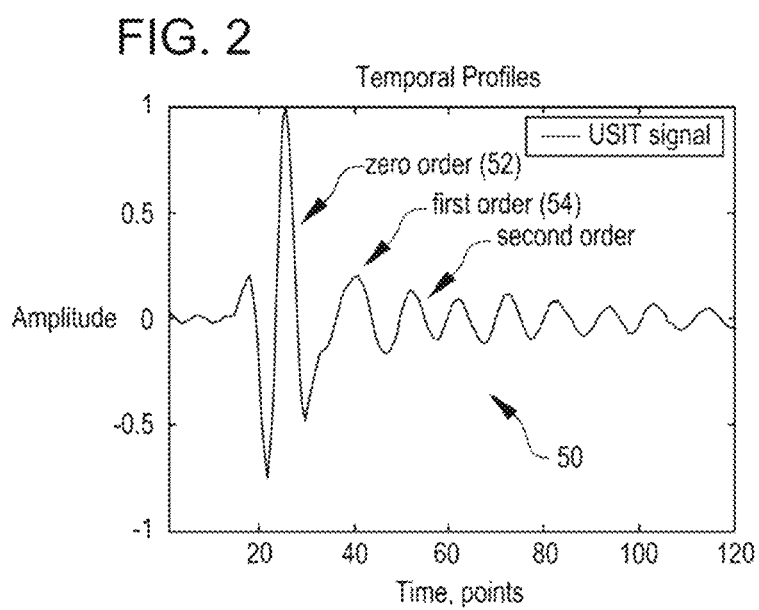
FIG. 2 shows an example response waveform measured by a down-hole ultrasonic inspection tool.

FIG. 2 shows an example measured response waveform 50 generated by the down-hole ultrasonic inspection tool 14 for the case where the annulus is thick enough to ignore the reflection from the sealing medium 24/ground formation 16 interface. The detected response waveform is the result of reverberation of the initial (probe) ultrasonic signal inside the casing 18 with partial transmission of waves back to the transducer 26. In many embodiments, a simulated signal is analytically formed to fit the measured response waveform 50. The measured response waveform 50 includes a first large transient ("zero-order" 0 reflection 52) corresponding to the initial reflection wave, a second transient ("first-order" reflection 54), as well as subsequent higher order transients corresponding to respective subsequent higher order reflections from the well casing outer surface 20.

The progressive decay in the amplitude in the transients is indicative of the acoustic impedance of the surrounding sealing medium 24. Using a one-dimensional plane wave approximation, a simulated signal can be computed and compared with the measure response waveform 50 as follows. First, the amplitude of the zero-order reflection 52 is given by:

$$P_0 = 1 * R_{01}, \quad \text{(equation 1)}$$

where $R_{01}$ is the ultrasonic wave reflection coefficient at a mud/well casing 18 interface to account for the presence of mud within the well casing 18.

The first-order reflection reaches the transducer 26 after sequential reflection from the well casing outer surface 20 and transmission through the well casing inner surface 32. Using a one-dimensional plane wave approximation, the amplitude of the first-order reflection 54 can be given by:

$$P_1 = 1 * R_{12}(1 - R_{10})^2, \quad \text{(equation 2)}$$

where $R_{10} = -R_{01}$ and $R_{10} = (z_1 - z_0)(z_1 + z_0)$, $R_{12} = (z_2 - z_1)(z_2 + z_1)$; $z_0$, $z_1$ and $z_2$ are acoustic impedances of mud, the well casing 18 (e.g., steel), and the surrounding sealing medium 24 (e.g., cement) respectively. Similarly, reflection coefficients can be defined for the boundary between the sealing medium 24 in the annulus and the ground formation 16.

For high order reflections, using a one-dimensional plane wave approximation, the amplitudes can be given by:

$$P_i = P_{i-1} * R_{10} * R_{12}, \text{ where } i > 2. \quad \text{(equation 3)}$$

When the annulus is thin enough that the signal reflected from the sealing medium 24/ground formation 16 interface arrives at the transducer 26 within the detected time window, similar transmission and reflection coefficients can be used to account for the interface between the sealing medium 24 in the annulus and the ground formation 16.

Using equations (1), (2), and (3), and similar equations for the sealing medium 24/ground formation 16 interface (for the case of a thin annulus), the amplitudes of transients in simulated response waveforms can be generated for a suitable set of candidate acoustic impedances of the surrounding sealing medium 24 and the acoustic impedance of the ground formation 16. The simulated response waveforms can then be compared to the measured response waveform 50 to identify which one best matches the measured response waveform 50 so as to identify which of the candidate surrounding sealing medium 24 acoustic impedances corresponds to the measured response waveform 50. The interface between the surrounding sealing medium 24 and the ground formation 16 can also be accounted for in the determination of the simulated response waveforms. Reflections from the interface between the sealing medium 24 and the ground formation 16 will, however, reach the transducer 26 with much smaller amplitudes than reflections induced by ultrasonic reverberations within the well casing 18. For the case where the annulus is thin enough to affect the measured response waveform 50, reflection from the interface between the sealing medium 24 and the ground formation 16 can be taken into account when generating a simulated response waveform to match the measured response waveform 50.

Figure 3:
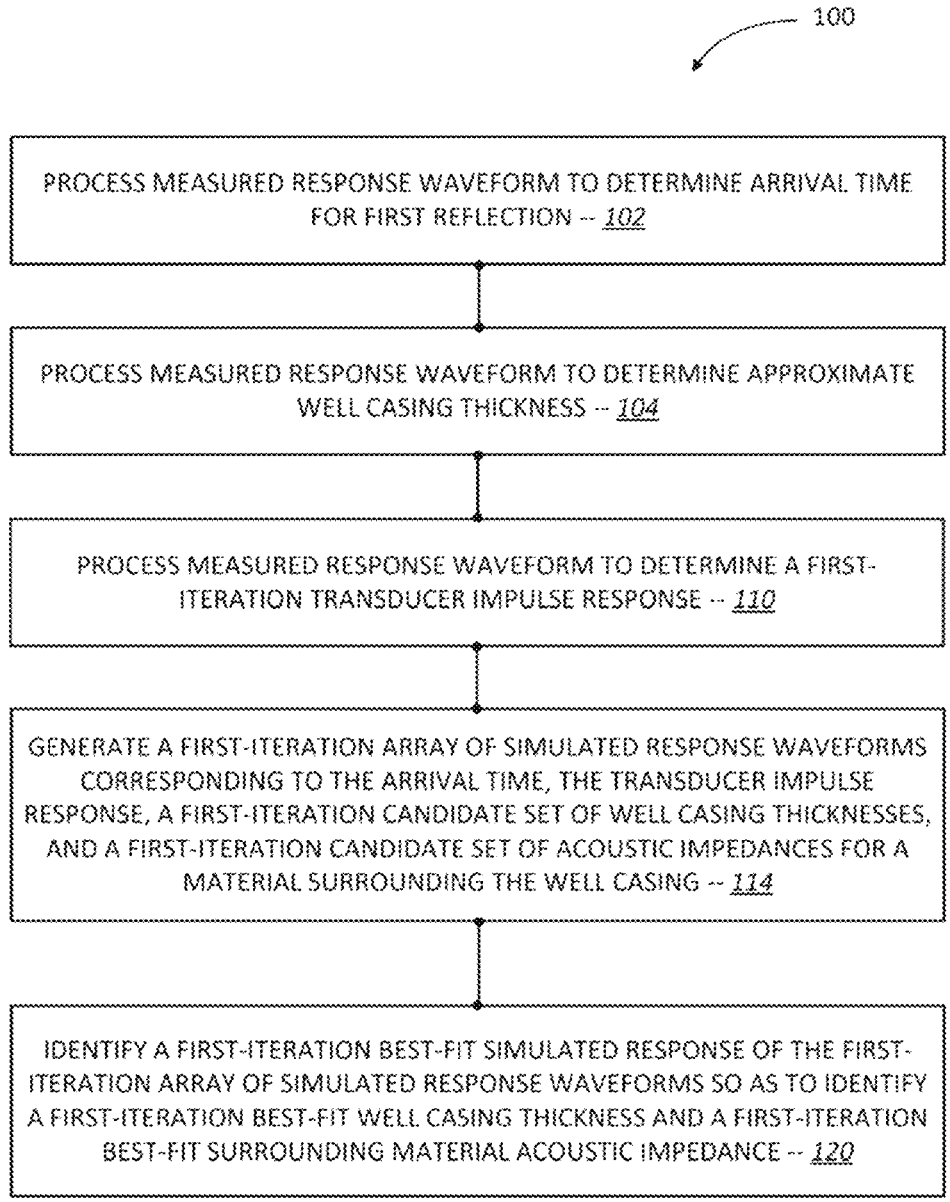
FIG. 3 is a simplified schematic diagram of a method of processing a measured ultrasonic response waveform to determine a well casing thickness and an acoustic impedance of an annulus sealing medium surrounding the well casing, in accordance with many embodiments.

FIG. 3 is a simplified schematic diagram of acts of a computer-implemented method 100 of processing a measured ultrasonic response waveform to determine a well casing thickness and an acoustic impedance of a sealing medium surrounding the well casing, in accordance with many embodiments. The method 100 can optionally include processing a measured response waveform to determine an arrival time for a first reflection from the well casing inner surface 32 (act 102). For example, referring to FIG. 2, the measured response waveform 50 can be processed to determine the point in time corresponding to the peak in the zero-order reflection transient 52. The arrival time can be used to determine a distance between the transducer 26 and the well casing inner surface 32. In embodiments, the distance between the transducer 26 and the inner surface 32, as well as displacement of the transducer 26 from its nominal position at the center of the well casing 18, is used to correct for two-dimensional effects when generating candidate simulated response waveforms.

Figure 4:
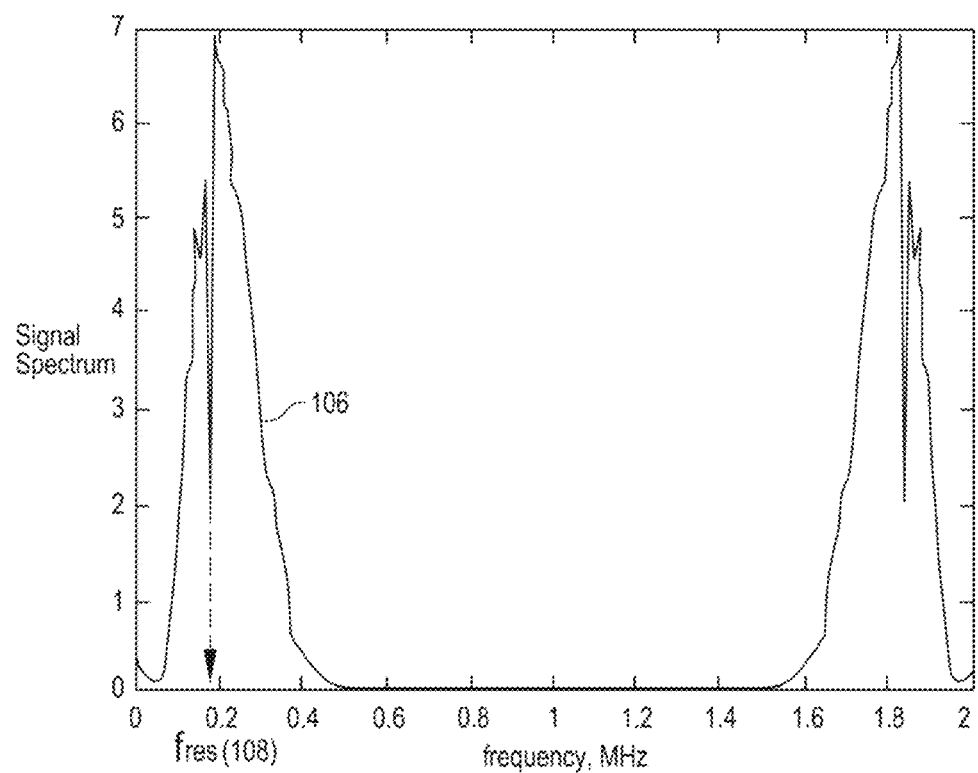
FIG. 4 shows a frequency spectrum of a measured response waveform that can be used to identify a characteristic frequency used to estimate well casing thickness, in accordance with many embodiments.

The method 100 can optionally include processing the measured response waveform 50 to determine the approximate thickness of the well casing 18 (act 104). For example, as illustrated in FIG. 4, the measured response waveform 50 can be processed to generate a frequency spectrum 106 that can be processed to identity a characteristic frequency 108. The characteristic frequency 108 corresponds to the time of double propagation of the ultrasonic signal within the well casing 18. In many embodiments, the characteristic frequency 108 is used to estimate thickness of the well casing 18.

Figure 5:
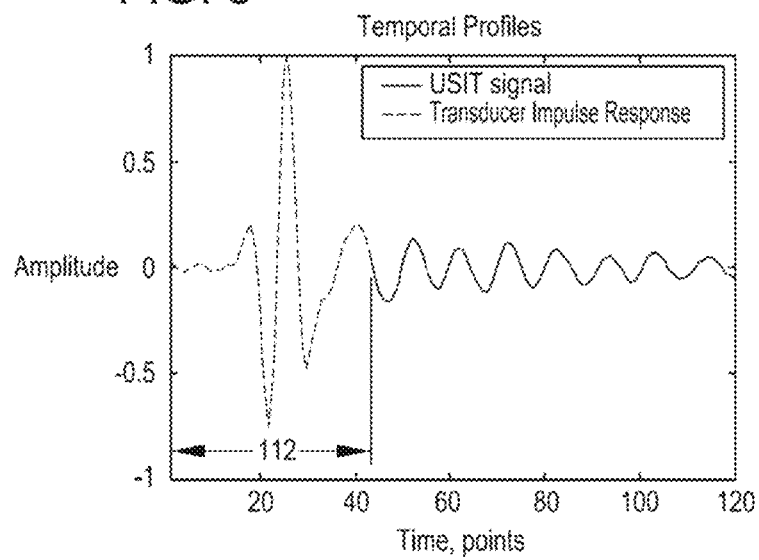
FIG. 5 illustrates a portion of the example measured response waveform of FIG. 1 that can be used to approximate a transducer impulse response, in accordance with many embodiments.

In act 110, the measured response waveform 50 is processed to determine a first-iteration transduces impulse response. For example, referring to FIG. 5, an initial portion 112 of the measured response waveform 50 can be selected as the first-iteration transducer impulse response. Any suitable initial portion of the measured response waveform, for example, the first 34 to 38 time points in a 120 time point waveform, can be selected as the transducer impulse response. Alternatively, the transducer impulse response can be measured experimentally using a reflection from a thick and flat metal plate emulating an infinite half space.

In act 114, a first-iteration array of simulated response waveforms is generated based on the transducer impulse response, a first-iteration candidate set of well casing thicknesses, a first-iteration candidate set of acoustic impedances for the surrounding sealing medium 24, a first-iteration set of candidate annulus thicknesses based on the expected thickness of the sealing layer, and a set of suitable candidate values for the acoustic impedance for the ground formation 16 surrounding the annulus. For example, the candidate well casing thickness can be selected to cover a range that includes an expected nominal thickness for the particular well casing thickness or can be based on an approximate casing thickness determined by processing the measures response waveform as in act 104. Likewise, any suitable set of values can be used for the first-iteration set of candidate 50 sealing medium acoustic impedances. For example, the first-iteration set of candidate sealing medium acoustic impedances can be selected to cover a suitable range of acoustic impedances from an acoustic impedance corresponding to a well-sealed annulus to an acoustic impedance corresponding to the lack of sealing medium. Similarly, the first-iteration set of candidate annulus thicknesses can be based on the expected thickness of the sealing layer and a suitable set of values can be used for the acoustic impedance for the ground formation 16 based on the known geological formation at any depth and azimuth In many cases, the annulus can be considered thick enough that echoes from the annulus sealing medium 24/ground formation 16 interface 22 can be ignored. For these cases, the parameters used in the matching procedure described below can be the casing thickness and the acoustic impedance of the sealing medium 24 in the annulus surrounding the casing 18. In the description that follows, details of the matching procedure are presented using a two parameter model for ease in understanding since the ultimate outputs of the processing described herein are robust estimates of the well casing thickness and the acoustic impedance for the sealing medium 24 in the annulus around the well casing. Nevertheless, all steps apply equally to a four parameter model that also includes the thickness of the sealing medium 24 and the acoustic impedance of the ground formation 16 for those cases where the influence of signals from the "third interface" 22 is significant.

Figure 6:
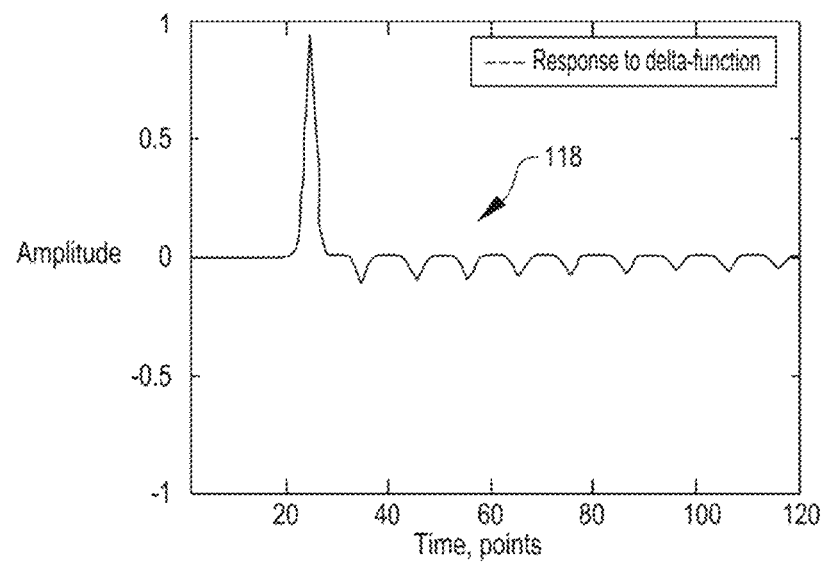
FIG. 6 shows an example response waveform to a delta-function ultrasonic probe signal that can be modified to account for diffraction, refraction, and the resulting size of the ultrasound beam at the transducer plane to generate a simulated response waveform corresponding to a candidate well casing thickness and a candidate acoustic impedance for the sealing medium in the annulus surrounding the well casing, in accordance with many embodiments.
Figure 7:
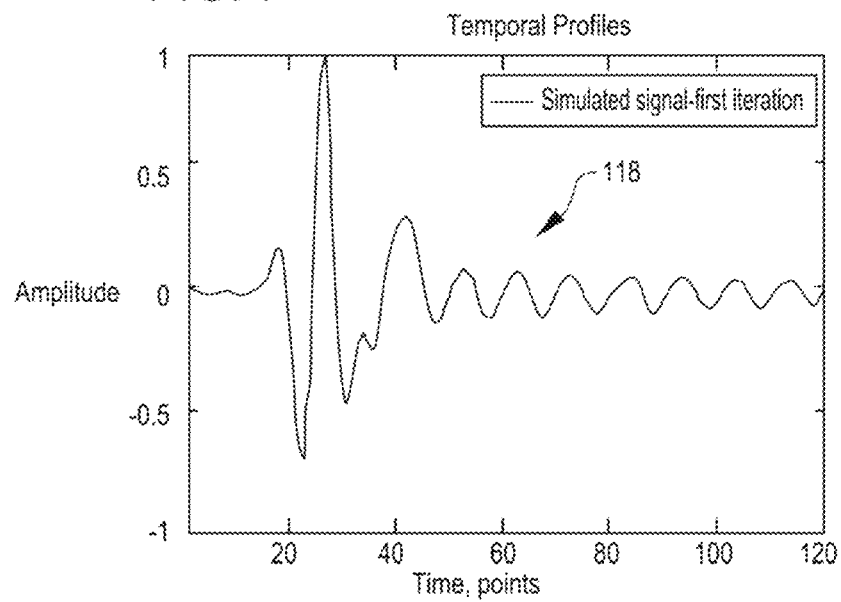
FIG. 7 shows an example first-iteration simulated response waveform generated by convolving the response waveform of FIG. 6 with the transducer impulse response of FIG. 5, in accordance with many embodiments.

Any suitable approach can be used to generate each of the simulated response waveforms based on the respective candidate well casing thickness and the respective candidate surrounding sealing medium acoustic impedance. For example, a simulated response waveform can be generated by convolving the transducer impulse response with a calculated system response waveform. Any suitable calculated system response waveform can be used. For example, the ultrasonic incident pulse generated by the transducer 26 can be assumed to be a delta-function and the calculated system response waveform calculated for the delta function. FIG. 6 shows an example calculated system response waveform 116. In many embodiments, the reflection transients 118 in the calculated system response waveform 116 are spaced to reflect the candidate well casing thickness and the amplitudes of the reflection transients in the calculated system response waveform 116 are calculated to reflect the candidate surrounding sealing medium acoustic impedance. In embodiments, both the amplitude and pulse shape of the reflection transients 118 are adjusted to account for two-dimensional effects related to the exact position of the transducer 26 with respect to the inner surface 32 of the casing, including diffraction, refraction, well geometry, and the resulting beam size at the transducer plane. Alterations in both the amplitude and pulse shape of reflection transients 118 in a one-dimensional signal model as illustrated in FIG. 6 may be referred to herein as "1.3-D processing." FIG. 7 shows an example first-iteration simulated response waveform 118 generated by convolving the transducer impulse response with the calculated system response waveform 116.

Figure 8:
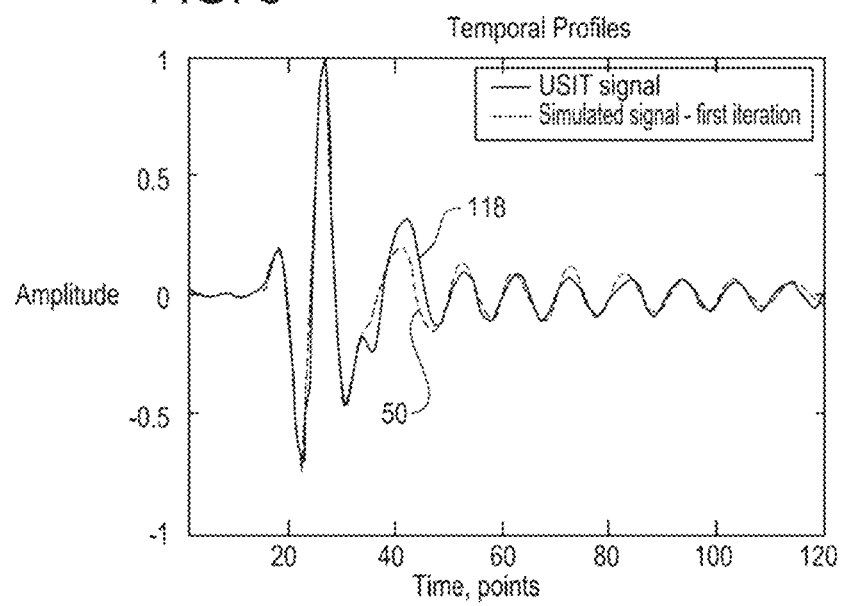
FIG. 8 shows an overlay comparing the measured response waveform of FIG. 2 with the example first-iteration simulated response waveform of FIG. 7, in accordance with many embodiments.

In act 120, a first-iteration best-fit simulated response of the first-iteration array of simulated response waveforms is identified so as to identify a first-iteration best-fit well casing thickness and a first-iteration best-fit sealing medium impedance. For example, each of any suitable number of the array of first-iteration simulated response waveforms can be compared to the measured response waveform via a least-squares comparison to select one of the first-iteration array of simulated response waveforms that best-fits the measured response waveform. FIG. 8 shows a plot that includes the example measured response waveform 50 and the simulated response waveform 118. The candidate well casing thickness and the candidate sealing medium acoustic impedance corresponding to the first-iteration best-fit simulated response can be identified as being the well casing thickness and the sealing medium acoustic impedance for the measured response-waveform.

Figure 9:
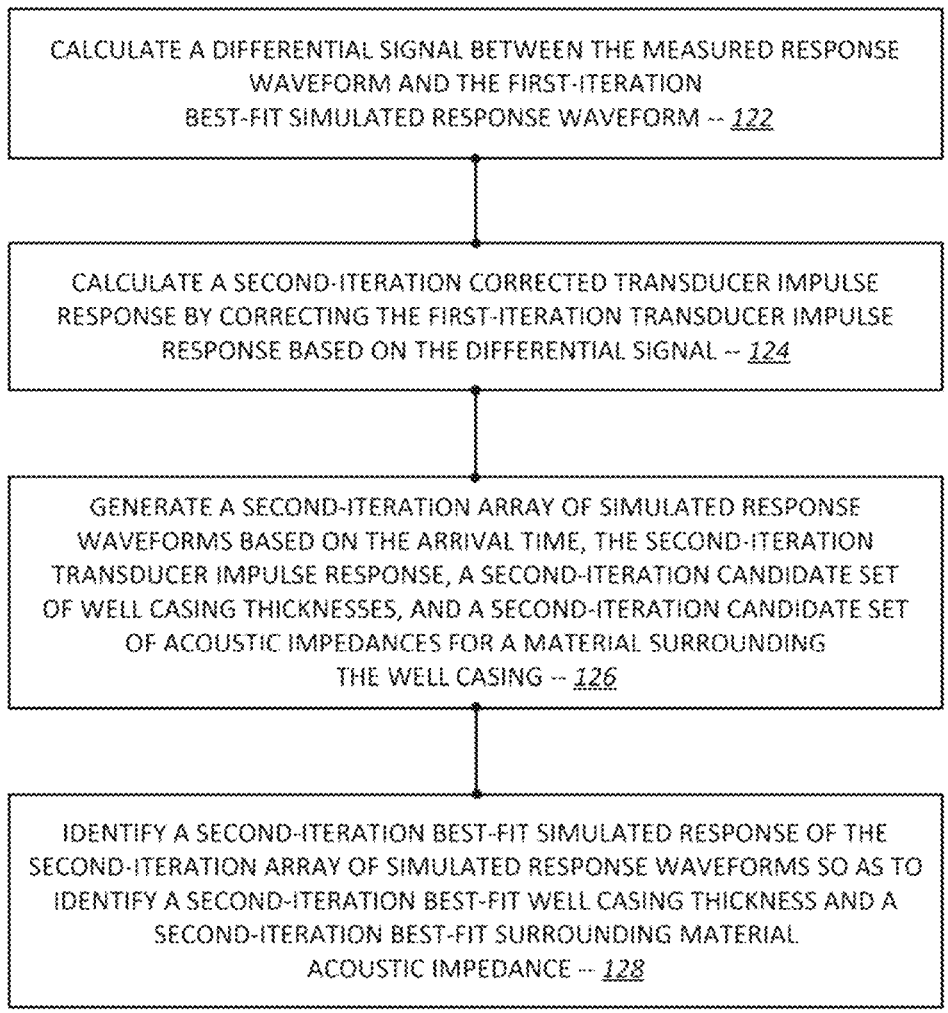
FIG. 9 is a simplified schematic diagram of acts for a second iteration in the method of FIG. 3, in accordance with many embodiments.

A second iteration can be performed using a corrected transducer impulse response to generate a second-iteration array of candidate simulated response waveforms that may more closely match the measured response waveform due to reduced errors induced by the estimated transducer impulse response used. FIG. 9 is a simplified schematic diagram of acts for a second iteration that can be performed in the method 100, in accordance with many embodiments. In act 122, a differential signal (Difference(t)) is calculated between the measured response waveform 50 and the first-iteration best-fit simulated response waveform. In act 124, a corrected impulse response can be determined as:

$$1R_1(t)=1R(t)-\text{Difference}(t) \qquad \text{equation (4)}$$

where Difference(t) is the differential signal, i.e. the difference between the first-iteration best-fit simulated response waveform and the measured response waveform 50. In act 126, a second-iteration array of simulated response waveforms is generated based on the second-iteration transducer impulse response, a second-iteration set of candidate set of well casing thicknesses (which can be the same or different that the first-iteration set of candidate well casing thicknesses), and a second-iteration set of acoustic impedances for the sealing medium (which can be the same or different from the first-iteration set of candidate sealing medium acoustic impedances). The second-iteration array of simulated response waveforms can be generated using a similar approach as described herein for the first-iteration array of simulated response waveforms. In act 128, a second-iteration best-fit simulated response of the second-iteration array of simulated response waveforms is identified so as to identify a second-iteration best-fit well casing thickness and a second-iteration best-in sealing medium impedance. The second-iteration best-fit simulated response can be identified using a similar approach as described herein for identifying the first-iteration best-fit simulated response.

FIG. 10A is a plot that includes the example measured response waveform 50, the example first-iteration simulated response waveform 118, and a second-iteration simulated response waveform 124 based on the corrected impulse response. As can be seen, the second-iteration simulated response waveform 124 matches the measured response waveform 50 better than the first-iteration simulated response waveform 118. Although similar additional iterations can be performed, almost no difference was obtained for a third iteration compared with a second iteration. Once the second-iteration array of simulated response waveforms has been generated, the second-iteration best-fit simulated response can be identified using a similar approach as for the first iteration.

FIG. 10B and FIG. 10C show overlays comparing simulated response waveforms for an infinitely thick cement-filled annulus surrounding a well casing and cement-filled annuluses having two different finite thicknesses, in accordance with many embodiments. When the thickness of the sealing medium is thin enough such that reflections from the sealing medium 24/ground formation 16 interface 22 significantly affect the measured waveform 50, reflections from the sealing medium 24/ground formation 16 interface 22 can be accounted for during generation of simulated waveforms matched to the measured response waveform 50. Reflections from the sealing medium 24/ground formation 16 interface 22 may produce an additional chain of signals, which may be referred to herein as a "third interface signal". The third interface signal may be directly related to reverberations of the probe signal in the casing before or after it is reflected from the third interface. The third interface signal can be superposed with the primarily signal created by the reverberation of the probe signal within the casing and produces an altered tail in the echo train depending on the thickness of the annulus. The resulting simulated signal tail (shown for two different cement thicknesses in FIG. 10B and FIG. 10C) can be generated via a superposition of the primarily signal with the third interface signal, where the characteristics of the tail depend on the sealing medium thickness, sealing medium impedance, and the impedance of the ground formation surrounding the sealing medium. As seen in FIG. 10B for a 16.88 mm thick annulus filled with cured cement, the tail (QQ) of the echo train is actually higher than that of an infinite cement layer. If interpreted with a simple two-parameter model, the computed impedance of the sealing medium 24 will be significantly underestimated. As seen in FIG. 10C for a 29.19 mm thick annulus filled with cured cement, the tail (RR) is significantly altered compared to that for the infinite cement layer. Because later echoes in the train for the 29.19 mm case attenuate more slowly, a two-parameter model would again produce an underestimated impedance for the sealing medium 24 in the annulus. Overall, when the annulus is thin, the third interface reflection can be taken into account to better estimate the acoustic impedance of the sealing medium 24 in the annulus.

Figure 11:
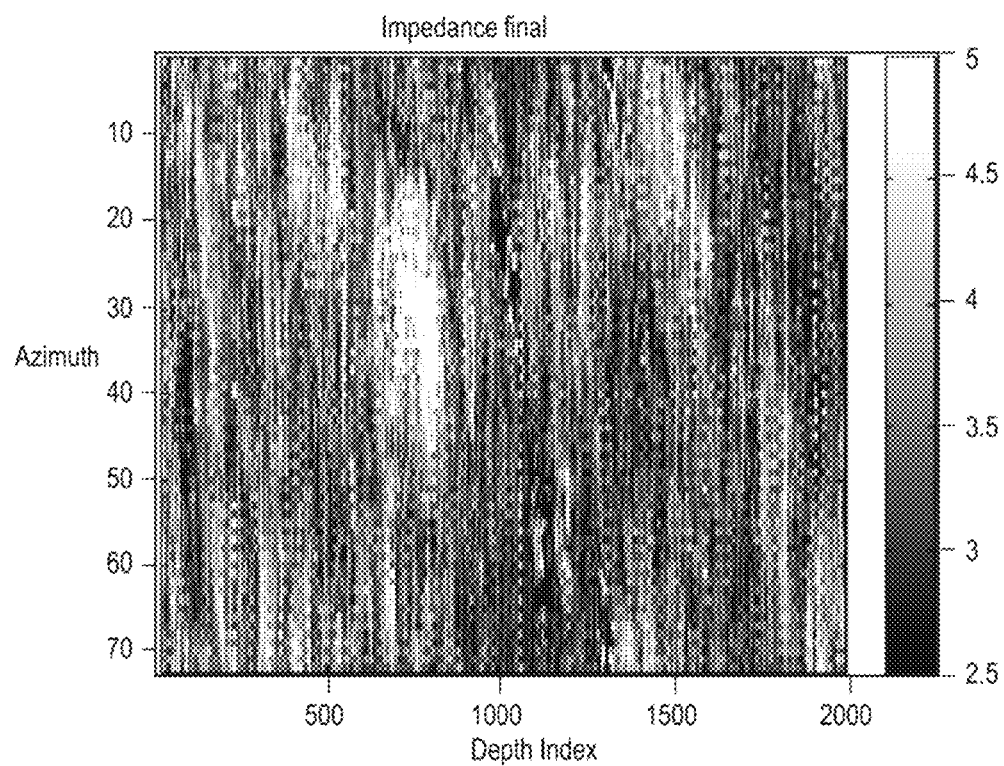
FIG. 11 shows a resulting contour plot of surrounding annulus sealing medium acoustic impedance for a range of depths and azimuth angles based on plane wave approximation based simulated response waveforms, in accordance with many embodiments.

The approaches described herein can be repeated to process measured response waveforms resulting from the inspection of any suitable number of inspection points in a well. For example, in many embodiments, the down-hole inspection tool 14 is configured to rotate the ultrasonic transducer 26 to generate measured response waveforms for different azimuth angles and to be moved vertically within the well casing 18 to generate measured response waveforms for different well depths. Each of the resulting array of measured response waveforms can be processed as described herein to generate corresponding best-fit well casing thickness values and best-fit surrounding sealing medium acoustic impedance values. Any suitable approach can be used to output the resulting values. For example, FIG. 11 shows a resulting contour plot of surrounding sealing medium acoustic impedance for a range of depths and azimuth angles based on plane wave approximation (i.e., one-dimensional) based simulated response waveforms.

Figure 12:
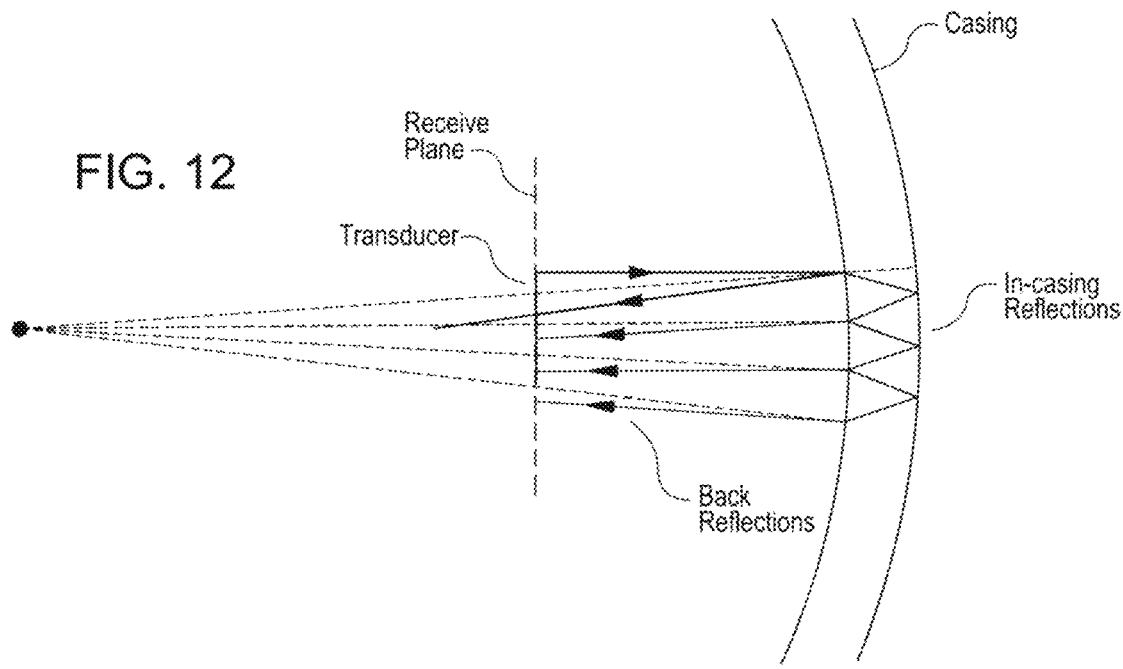
FIG. 12 illustrates how two-dimensional effects associated with the cylindrical well casing can change the direction of the waves such that higher-order reflections miss the transducer.

The simulated response waveforms can also be generated to account for two-dimensional effects so as to better account for ultrasonic propagation relative to a plane-wave approximation. FIG. 12 illustrates how two-dimensional effects associated with the cylindrical well casing can change the direction of the waves such that higher-order reflections miss the transducer 26. In particular, the pulse shape and amplitude of each reflection can be affected by diffraction and refraction effects.

Figure 13:
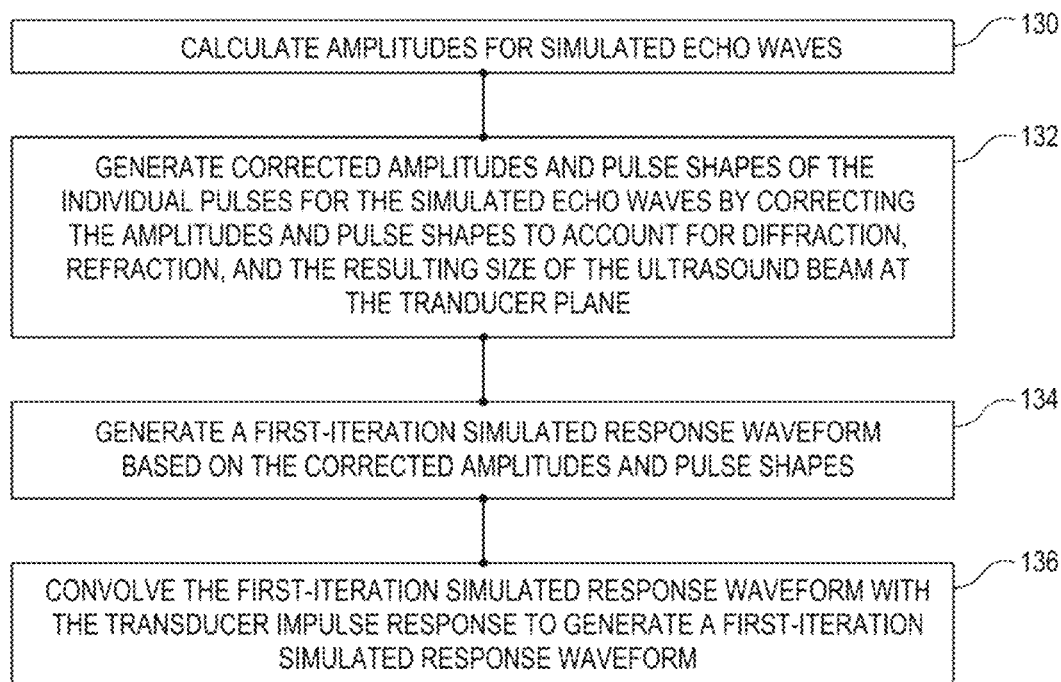
FIG. 13 is a simplified schematic diagram of acts for generating a simulated response waveform that accounts for two-dimensional effects, in accordance with many embodiment.

FIG. 13 is a simplified schematic diagram of acts for generating a simulated response waveform that accounts for two-dimensional effects, in accordance with many embodiments. In act 130, amplitudes of simulated echo waves are calculated. The amplitudes of the simulated echo waves can be calculated using a plane-wave approximation. In act 132, corrected amplitudes and pulse shapes of the individual pulses are obtained by accounting for diffraction, refraction, and the resulting size of the ultrasound beam at the transducer plane, as described herein. Alterations in both the amplitude and pulse shape of reflection transients 118 in a one dimensional signal model as illustrated in FIG. 6 may be referred to herein as "1.3-D processing." Any suitable approach can be used to correct the amplitudes and pulse shapes such as described herein. In act 134, a first-iteration simulated response waveform is generated based on the corrected amplitudes and pulse shapes. In act 136, the first-iteration simulated response waveform is convolved with the transducer impulse response to generate a first-iteration simulated response waveform that accounts for two-dimensional effects.

Figure 14:
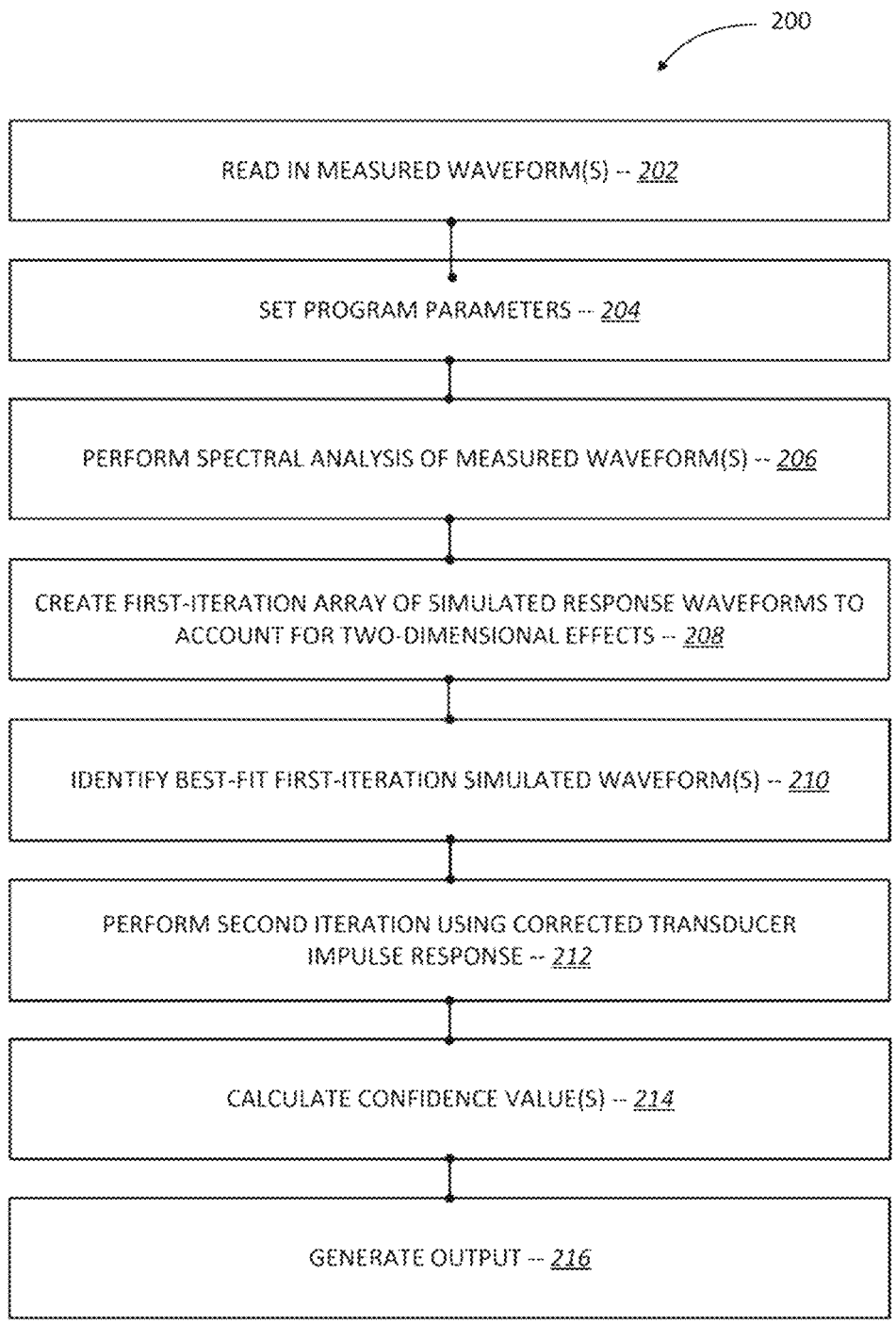
FIG. 14 is a simplified schematic diagram of a method of processing a measured ultrasonic response waveform to determine a well casing thickness and an acoustic impedance of a sealing medium in the annulus surrounding the well casing, in accordance with many embodiments.

FIG. 14 is a simplified schematic diagram of acts of a computer-implemented method 200 of generating a simulated response waveform that accounts for two-dimensional effects, in accordance with many embodiments. The computer-implemented method 200 includes (a) reading in the measured response waveform (act 202), (b) setting program parameters (act 204), (c) performing spectral analysis of a measured response waveform (act 206), (d) creating a first-iteration array of simulated response waveforms so as to account for two-dimensional effects (act 208), (e) identifying which of the first-iteration simulated response waveforms best matches the measured response waveform (act 210), (f) performing a second iteration using a corrected transducer impulse response (act 212), (g) calculating a confidence value (act 214), and (h) generating output (act 216).

In act 204, any suitable parameter can be set for use in processing the measured response waveform using the approaches described herein. For example, the program parameters can include material densities, ultrasound speed in mud, ultrasound speed in the well casing 18, transducer diameter, distance from the transducer 26 to the well casing 18, inspection depth range, inspection azimuth range, range of measured response waveforms to process, determination of the transducer impulse response, which, as described herein, can initially be assumed to approximate an initial portion of a measured response waveform that does not include waves generated by reverberations of the ultrasonic impulse within the well casing.

In act 206, spectral analysis of the measured response waveform can be used to determine the resonant frequency of the ultrasonic reverberations within the well casing. The resonant frequency can then be used to estimate thickness of the well casing. The signal arrival time can be determined by finding the maximum of the Hilbert transformed (i.e., detected) signal.

In act 208, the first-iteration array of candidate simulated response waveform can be created as described herein. Reflection and transmission coefficients can be defined at all the interfaces, including the 'third interface' 22 between the sealing medium 24 and the ground formation 16. Initial echo amplitudes can be calculated. The initial echo amplitudes and pulse shapes in the echo train 118 shown in FIG. 6 can be corrected using a numerical simulation of multi-dimensional wave propagation from the transducer 26 based on the position of the transducer 26 relative to the front casing surface 32. A finite element simulation of wave propagation can predict pulse shape changes of each pulse in the echo train 118 compared to the assumed delta function excitation of the transducer. Similarly, the amplitude of each echo in the echo train 118 can be corrected according to the parabolic diffraction equation, refraction coefficients, and the resulting beam diameter at the transducer 26. Alterations in both the amplitude and pulse shape of reflection transients 118 in a one dimensional signal model as illustrated in FIG. 6 may be referred to herein as "1.3-D processing."

Using the parabolic diffraction equation:

$$\left(\vec{\tau}\vec{\nabla} + \frac{i}{2}\frac{d^2k}{d\omega^2}\frac{\partial^2}{\partial \tau^2}\right)A - \frac{i}{2k}\Delta_\perp A = 0 \qquad \text{equation (5)}$$

where k is the wave number and A is the complex amplitude, the solution for Gaussian beams for the amplitude, beam radius, and wavefront curvature gives:

$$A(z) = \frac{A(0)}{\sqrt{1+D^2}}\exp\left[-\frac{r^2}{a_0^2(1+D^2)}\right] \qquad \text{equation (6)}$$

-continued $$a^2(z) = a_0^2(1 + D^2) \quad \text{equation (7)}$$

$$\frac{1}{R(z)} = \frac{1}{a_0} \frac{\sqrt{D}}{\sqrt{1+D^2}} \quad \text{equation (8)}$$

where $r=\sqrt{x^2+y^2}$ is the distance from the transducer normal, $a_0$ is the transducer radius, and $$D = z/l_d, \quad l_d = \frac{\pi a_0^2}{C_3} f$$

is the diffraction length. The simulated response waveform can be generated as a train of echo signals. Initially, each echo can have a temporal profile of a very short Gaussian signal (mimicking delta-function):

$$Gauss_n(t_n) = A_n \exp\left(-\frac{(t-t_n)^2}{\tau_0^2}\right), \quad \text{equation (9)}$$

where $\tau_0$ is equal to digitization time of the measured response waveform, $t_n = 2nH/C_S$ is the arrival time $n_{th}$ echo, and amplitude $A_n$ is equal to the reflection coefficient corresponding to the respective echo adjusted by the correction of equation (6). The Gaussian temporal profile for each pulse can be adjusted based on the results of computational models of wave propagation that includes the effects of diffraction and refraction given the transducer position relative to the front casing surface 32 to produce the modified echo pulse $Echo_n(t_n)$. Thus:

$$S_{sim}(t) = \Sigma_{n=1}^{Nech} Echo_n(t_n) \quad \text{equation (10)}$$

where $N_{ech}$ is a number of echoes in the measured response waveform. The resulting chain of echoes can be convolved then with the transducer impulse response:

$$R_{sim}(t) = S_{sim}(t) \otimes 1R(t) \quad \text{equation (11)}$$

to finalize the creation of the simulated response waveform for the respective combination of candidate well casing thickness, candidate surrounding sealing medium acoustic impedance, and when appropriate, candidate annulus thickness and candidate acoustic impedance for the surrounding ground formation. The process can be repeated for each respective combination of candidate well casing thickness, candidate surrounding sealing medium acoustic impedance, candidate annulus thickness and candidate acoustic impedance for the surrounding ground formation to generate the first-iteration array of candidate simulated response waveforms.

A simulated response waveform can be generated for each combination of candidate parameters (e.g., well casing thickness, surrounding sealing medium acoustic impedance, annulus thickness and acoustic impedance for the ground formation). In many embodiments, the surrounding sealing medium is cement and the cement acoustic impedance is set in the range of 0 to 10 Mrayl with a step of 0.1 Mrayl. The casing thickness can be varied about a nominal casing thickness (e.g., a nominal casing thickness of the well casing being inspected, an approximate casing thickness determined via the spectral analysis of the measured response waveform as described herein). The casing thickness can be varied about the nominal casing thickness in any suitable step (e.g., about 1% of the nominal casing thickness). When appropriate, the annular thickness can be varied about the nominal annular thickness in any suitable step (e.g., about 1% of the nominal casing thickness) and the acoustic impedance for the ground formation can be varied about the nominal value in any suitable step (e.g., about 1% of an anticipated nominal acoustic impedance of the ground formation).

In act 210, the first-iteration casing thickness, first-iteration acoustic impedance of the sealing medium, first-iteration annulus thickness and first-iteration acoustic impedance for the ground formation can be determined by solving the inverse problem to find which of the first-iteration array of simulated response waveforms best matches the measured response waveform. A matrix of integral time-gain normalized mean-squared difference between the simulated response waveforms and the measured response waveform can be calculated for the whole array of simulated parameters:

$$Diff_{Nsim} = \Sigma_{i=1}^{Npoints}(R_{sim}(i) - S_{ex}(i))^2 / Att^2, \quad \text{equation (12)}$$

where $Att(i)$ is the effective attenuation of the reflection echo train, to scale for the decaying waveform amplitude and make the contribution from all echoes to the total difference approximately equal. The best matched simulated response-waveform is assumed to be based on the values of casing thickness and sealing-material acoustic impedance that best match actual values.

In act 212, the second iteration can be performed using the corrected transducer impulse response. The differential signal $S_{dif}(i) = R_{sim}(i) - S_{ex}(i)$ between the first-iteration best-fit simulated response waveform and the measured response waveform can be calculated for the best matched parameter set. The temporal profile of the transducer response used in the first-iteration can be corrected by the differential signal. Solution of the inverse problem is repeated for the second-iteration array of simulated response waveforms, which can be generated using the corrected transducer impulse response.

In acts 214 and 216, the set of results can include (a) a two-dimensional plot (e.g., a shaded contour plot, a contour line plot) of surrounding sealing medium acoustic impedances Zc obtained for all depth and azimuthal points (e.g., as shown in FIG. 15); (b) a two-dimensional plot (e.g., shaded contour plot, a contour line plot) of casing thicknesses H for all depth and azimuthal points; and (c) a confidence matrix indicative of how closely each of best-fit simulated response waveforms corresponds to the respective measured response waveform by, for example, calculating confidence values equal to the inverse of the integral of the time-gain normalized mean-squared difference between the respective best-fit simulated response waveform and respective measured response waveform for each depth and azimuthal position. Regions of low confidence indicate areas where the measured surrounding sealing medium acoustic impedance values may not be reliable. Regions of high confidence indicate areas where the measured surrounding sealing medium acoustic impedance values are likely to be reliable.

In addition to the confidence values, more complex measures of confidence can be obtained via a multivariable analysis of the measured surrounding sealing medium acoustic impedance, the measured well casing thickness, and the confidence value. For example, in addition to raw impedance, thickness, and confidence value maps, spatial gradients of these parameters in both depth and azimuthal directions can be computed. By setting "soft" thresholds on these parameters (values themselves as well as gradients)

using sigmoid functions, the final confidence can be computed using a fuzzy logic approach where simple logic processing on the outputs of the soft thresholds can be used to determine a final confidence value.

In addition to displaying the confidence value independent of the acoustic impedance of the sealing medium, the two estimates can be combined into a simple image, where the confidence is used to modulate the estimated sealing medium acoustic impedance value. For example, the sealing medium acoustic impedance can be displayed using a pure Chroma scale and the confidence can be used to set the absolute brightness (luminance) at each pixel. In this way, low confidence regions are simply black whereas high confidence regions show the sealing medium acoustic impedance values in color. There are many variations on this theme where confidence and sealing medium acoustic impedance values can be combined into a single optimized display.

Some or all of the methods described herein (or any other processes described herein, or variations, and/or combinations thereof) may be performed under the control of one or more computer systems configured with executable instructions and may be implemented as code (e.g., executable instructions, one or more computer programs, or one or more applications) executing collectively on one or more processors, by hardware or combinations thereof. The code may be stored on a computer-readable storage medium, for example, in the form of a computer program comprising a plurality of instructions executable by one or more processors. The computer-readable storage medium may be non-transitory.

Other variations are within the spirit of the present invention. Thus, while the invention is susceptible to various modifications and alternative constructions, certain illustrated embodiments thereof are shown in the drawings and have been described above in detail. It should be understood, however, that there is no intention to limit the invention to the specific form or forms disclosed, but on the contrary, the intention is to cover all modifications, alternative constructions, and equivalents falling within the spirit and scope of the invention, as defined in the appended claims.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A computer-implemented method of processing a measured ultrasonic response waveform to determine a value indicative of whether a sealing medium acoustic impedance is within a designated range, the method comprising:
    transmitting an ultrasonic signal from an ultrasonic inspection tool toward the well casing from within the well casing;
    generating, via an ultrasonic transducer, a measured response waveform resulting from the transmitted ultrasonic signal, wherein the ultrasonic inspection tool comprises the ultrasonic transducer;
    processing the measured response waveform to determine an arrival time for a first reflection from the well casing;
    generating a plurality of simulated response waveforms corresponding to the arrival time, a set of candidate acoustic impedances for the sealing medium in the annulus, a set of candidate well casing thicknesses, a set of candidate annulus thicknesses, and a set of candidate properties comprising acoustic impedances for one or more interfaces between the sealing medium and a ground formation surrounding the annulus;
    identifying a best-fit simulated response waveform from the plurality of simulated response waveforms that best matches the measured response waveform;
    determining, based on the identified best-fit simulated response waveform, the value indicative of whether the sealing medium acoustic impedance is within the designated range; and
    outputting the value indicative of whether a sealing medium acoustic impedance is within the designated range to a user via an output device.

2. The computer-implemented method of claim 1, further comprising:
    processing a portion of the measured response waveform to determine an approximate thickness of the well casing; and
    selecting the set of candidate well casing thicknesses based on the approximate thickness of the well casing.

3. The computer-implemented method of claim 1, further comprising processing a portion of the measured response waveform to determine a transducer impulse response for an ultrasonic transducer used to generate the measured response waveform, and wherein each of the plurality of simulated response waveforms is based on the transducer impulse response.

4. The computer-implemented method of claim 3, wherein generating each of the plurality of simulated response waveforms comprises:
    calculating amplitudes for simulated echo waves returning to the ultrasonic transducer from the well casing and at least one interface between the sealing medium in the annulus and the ground formation surrounding the annulus;

generating corrected amplitudes and pulse shapes for the simulated echo waves by correcting the amplitudes and pulse shapes for the simulated echo waves to account for multi-dimensional propagation effects including diffraction, refraction, and resulting beam size at a transducer plane of the ultrasonic transducer;

generating a first simulated waveform based on the corrected amplitudes and pulse shapes; and convolving the first simulated waveform with the transducer impulse response to generate the respective simulated response waveform.

5. The computer-implemented method of claim 3, further comprising:

calculating a differential signal between the measured response waveform and the best-fit simulated response waveform;

calculating a corrected transducer impulse response for the ultrasonic transducer by correcting the transducer impulse response based on the differential signal;

generating a second-iteration plurality of simulated response waveforms based on the corrected transducer impulse response and corresponding to the arrival time, a second-iteration set of candidate acoustic impedances for the sealing medium surrounding the well casing, a second-iteration set of candidate well casing thicknesses, a second-iteration set of candidate annulus thicknesses, and a second-iteration set of candidate properties for at least one interface between the sealing medium and the ground formation surrounding the annulus; and identifying a second-iteration best-fit simulated response waveform from the second-iteration plurality of simulated response waveforms that best matches the measured response waveform, wherein the value indicative of whether the sealing medium acoustic impedance is within the designated range is determined based on the identified second-iteration best-fit simulated response waveform.

6. The computer-implemented method of claim 5, wherein generating each of the second-iteration plurality of simulated response waveforms comprises convolving a simulated response waveform with the corrected transducer impulse response to generate the respective simulated response waveform of the second-iteration plurality of simulated response waveforms.

7. The computer-implemented method of claim 1, wherein each of the plurality of simulated response waveforms is based on reflection of the ultrasonic signal from an inner surface of the well casing, reflection of the ultrasonic signal from an interface between the well casing and the sealing medium in the annulus, reflection of the ultrasonic signal from at least one other interface between the sealing medium in the annulus and the ground formation surrounding the annulus, and multiple reverberations of the ultrasonic signal within the well casing.

8. The computer-implemented method of claim 1, further comprising:

generating a confidence value based on deviation between the best-fit simulated response waveform and the measured response waveform;

identifying a best fit well casing thickness of the set of candidate well casing thicknesses;

identifying a best-fit sealing medium acoustic impedance of the set of candidate acoustic impedances for the medium in the annulus; and analyzing the best-fit well casing thickness, the best-fit sealing medium acoustic impedance, and the confidence value in combination to produce the value indicative of whether the sealing medium acoustic impedance is within the designated range.

9. The computer-implemented method of claim 1, further comprising identifying a best-fit sealing medium acoustic impedance of the set of candidate acoustic impedances for the medium in the annulus, wherein the value indicative of whether the sealing medium acoustic impedance is within the designated range is based on the identified best-fit sealing medium acoustic impedance.

10. The computer-implemented method of claim 8, wherein the value indicative of whether the sealing medium acoustic impedance is within the designated range is determined for a plurality of depths and a plurality of azimuth angles.

11. A system for processing a measured ultrasonic response waveform to determine a value indicative of whether a sealing medium acoustic impedance is within a designated range, the system comprising:

an ultrasonic inspection tool that transmits an ultrasonic signal toward the well casing from within the well casing, the ultrasonic inspection tool comprising an ultrasonic transducer that generates a measured response waveform resulting from the transmitted ultrasonic signal;

an output device;

a processor;

a tangible memory storing non-transient instructions executable by the processor to cause the processor to:

process a measured response waveform resulting from an ultrasonic signal transmitted toward the well casing from within the well casing to determine an arrival time for a first reflection from the well casing;

generate a plurality of simulated response waveforms corresponding to the arrival time, a set of candidate acoustic impedances for the sealing medium in the annulus, a set of candidate well casing thicknesses, a set of candidate annulus thicknesses, and a set of candidate properties comprising acoustic impedances for one or more interfaces between the sealing medium and a ground formation surrounding the annulus;

identify a best-fit simulated response waveform from the plurality of simulated response waveforms that best matches the measured response waveform;

determine, based on the identified best-fit simulated response waveform, the value indicative of whether the sealing medium acoustic impedance is within the designated range; and output, via the output device, the value indicative of whether a sealing medium acoustic impedance is within the designated range for display to a user of the system.

12. The system of claim 11, wherein the instructions are further executable by the processor to:

process a portion of the measured response waveform to determine an approximate thickness of the well casing; and select the set of candidate well casing thicknesses based on the approximate thickness of the well casing.

13. The system of claim 11, wherein the instructions are further executable by the processor to cause the processor to process a portion of the measured response waveform to determine a transducer impulse response for an ultrasonic transducer used to generate the measured response waveform, and wherein each of the plurality of simulated response waveforms is based on the transducer impulse response.

14. The system of claim 13, wherein the instructions are executable by the processor to cause the processor to, for each of the plurality of simulated response waveforms corresponding to the arrival time,
- calculate amplitudes for simulated echo waves returning to the ultrasonic transducer from the well casing and at least one interface between the sealing medium in the annulus and the ground formation surrounding the annulus;
- generate corrected amplitudes and pulse shapes for the simulated echo waves by correcting the amplitudes and pulse shapes for the simulated echo waves to account for multi-dimensional propagation effects including diffraction, refraction, well geometry, and a resulting beam size at a transducer plane of the ultrasonic transducer;
- generate a first simulated waveform based on the corrected amplitudes and pulse shapes; and
- convolve the first simulated waveform with the transducer impulse response to generate the respective simulated response waveform.

15. The system of claim 13, wherein the instructions are executable by the processor to:
- calculate a differential signal between the measured response waveform and the best-fit simulated response waveform;
- calculate a corrected transducer impulse response for the ultrasonic transducer by correcting the transducer impulse response based on the differential signal;
- generate a second-iteration plurality of simulated response waveforms based on the corrected transducer impulse response and corresponding to the arrival time, a second-iteration set of candidate acoustic impedances for the sealing medium surrounding the well casing, a second-iteration set of candidate well casing thicknesses within a range that includes the approximate thickness of the well casing, a second-iteration set of candidate annulus thicknesses within a range that includes an approximate thickness of the annulus, and a second-iteration set of candidate properties for at least one interface between the sealing medium and the ground formation surrounding the annulus; and
- identify a second-iteration best-fit simulated response waveform from the second-iteration plurality of simulated response waveforms that best matches the measured response waveform, wherein the value indicative of whether the sealing medium acoustic impedance is within the designated range is determined based on the identified second-iteration best-fit simulated response waveform.

16. The system of claim 15, wherein the instructions are executable by the processor to convolve a simulated response waveform with the corrected transducer impulse response to generate the respective simulated response waveform of the second-iteration plurality of simulated response waveforms.

17. The system of claim 11, wherein each of the plurality of simulated response waveforms is based on reflection of the ultrasonic signal from an inner surface of the well casing, reflection of the ultrasonic signal from an interface between the well casing and the sealing medium in the annulus, reflection of the ultrasonic signal from at least one other interface between the sealing medium in the annulus and the ground formation surrounding the annulus, and multiple reverberations of the ultrasonic signal within the well casing.

18. The system of claim 11, wherein the instructions are executable by the processor to:
- generate a confidence value based on deviation between the best-fit simulated response waveform and the measured response waveform;
- identify a best fit well casing thickness of the set of candidate well casing thicknesses;
- identify a best-fit sealing medium acoustic impedance of the set of candidate acoustic impedances for the medium in the annulus; and
- analyze the best-fit well casing thickness, the best-fit sealing medium acoustic impedance, and the confidence value in combination to produce the value indicative of whether the sealing medium acoustic impedance is within the designated range.

19. The system of claim 11, wherein the instructions are executable by the processor to identify a best-fit sealing medium acoustic impedance of the set of candidate acoustic impedances for the medium in the annulus, wherein the value indicative of whether the sealing medium acoustic impedance is within the designated range is based on the identified best-fit sealing medium acoustic impedance.

* * * * *